US007435108B1

(12) United States Patent
Eldridge et al.

(10) Patent No.: US 7,435,108 B1
(45) Date of Patent: Oct. 14, 2008

(54) VARIABLE WIDTH RESILIENT CONDUCTIVE CONTACT STRUCTURES

(75) Inventors: Benjamin N. Eldridge, Danville, CA (US); Gaetan Mathieu, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/364,788

(22) Filed: Jul. 30, 1999

(51) Int. Cl.
*H05K 1/00* (2006.01)

(52) U.S. Cl. ........................................ 439/81; 439/66

(58) Field of Classification Search .................. 439/71, 439/66, 81, 91, 482, 591; 361/772, 774, 361/776; 257/659; 438/618
See application file for complete search history.

(56) References Cited

U.S. PATENT DOCUMENTS 2,981,877 A 4/1961 Noyce
3,550,261 A 12/1970 Schroeder
3,653,999 A 4/1972 Fuller
3,662,454 A 5/1972 Miller
3,672,985 A 6/1972 Nathanson et al.
3,842,189 A 10/1974 Southgate
3,881,799 A 5/1975 Elliott et al.
3,952,404 A 4/1976 Matunami
4,022,641 A 5/1977 Lindberg
4,189,342 A 2/1980 Kock
4,423,401 A 12/1983 Mueller
4,553,192 A 11/1985 Babuka et al.
4,636,722 A 1/1987 Ardezzone
4,965,865 A 10/1990 Trenary
H842 H 11/1990 Ochs
5,070,297 A 12/1991 Kwon et al.
5,072,193 A 12/1991 Wilson et al.
5,090,118 A 2/1992 Kwon et al.
5,109,596 A 5/1992 Driller et al.
5,149,673 A 9/1992 MacDonald et al.
5,152,695 A * 10/1992 Grabbe et al. ................. 439/71
5,173,055 A 12/1992 Grabbe
5,177,438 A 1/1993 Littlebury et al.

(Continued)

FOREIGN PATENT DOCUMENTS

EP 295914 12/1988

(Continued)

OTHER PUBLICATIONS

Leung et al., "Active Substrate Membrane Probe Card", Technical Digest of the International Electron Devices Meeting (IEDM), pp. 709-712 Oct. 12, 1995.

(Continued)

*Primary Examiner*—Chandrika Prasad
(74) *Attorney, Agent, or Firm*—N. Kenneth Burraston

(57) ABSTRACT

Interconnect assemblies having resilient contact elements and methods for making these assemblies. In one aspect, the interconnect assembly includes a substrate and a resilient electrical contact element disposed on the substrate. A first portion of the resilient contact structure is disposed on the substrate and a second portion extends away from the substrate and is capable of moving from a first position to a second position under the application of a force. A stop structure is disposed on the surface of the substrate and on a surface of the first portion of the resilient contact structure. According to another aspect of the present invention, a beam portion of the resilient contact structure has a substantially triangular shape.

39 Claims, 11 Drawing Sheets

U.S. PATENT DOCUMENTS 5,185,652 A 2/1993 Waldron et al.
5,210,939 A 5/1993 Mallik et al.
5,228,861 A 7/1993 Grabbe
5,323,035 A 6/1994 Leedy
5,462,440 A 10/1995 Rothenberger
5,465,611 A * 11/1995 Ruf et al. ...................... 73/104
5,476,211 A 12/1995 Khandros
5,476,818 A 12/1995 Yanof et al.
5,495,667 A 3/1996 Farnworth et al.
5,513,430 A * 5/1996 Yanof et al. ................... 29/846
5,587,328 A 12/1996 Yoshida
5,613,861 A * 3/1997 Smith et al. ................... 439/81
5,632,631 A 5/1997 Fjelstad et al.
5,666,190 A 9/1997 Quate et al.
5,723,822 A 3/1998 Lien
5,723,894 A 3/1998 Ueno et al.
5,723,910 A 3/1998 Kariyazono et al.
5,756,370 A 5/1998 Farnworth et al.
5,763,941 A 6/1998 Fjelstad et al.
5,764,486 A 6/1998 Pendse
5,777,328 A 7/1998 Gooch
5,810,609 A * 9/1998 Faraci et al. .................. 439/71
5,828,226 A 10/1998 Higgins et al.
5,829,128 A 11/1998 Eldridge et al.
5,848,685 A 12/1998 Smith et al.
5,852,323 A 12/1998 Conn
5,904,498 A 5/1999 Fjelstad et al.
5,913,109 A 6/1999 Distefano et al.
5,915,170 A 6/1999 Raab et al.
5,917,707 A 6/1999 Khandros et al.
5,944,537 A * 8/1999 Smith et al. ................... 439/81
5,962,919 A 10/1999 Liang et al.
5,963,689 A 10/1999 Hesselbom
5,973,376 A 10/1999 Rostoker et al.
5,974,662 A 11/1999 Eldridge et al.
5,976,913 A 11/1999 Distefano
5,989,936 A 11/1999 Smith et al.
5,994,766 A * 11/1999 Shenoy et al. ............... 257/659
6,002,179 A 12/1999 Chan et al.
6,013,938 A 1/2000 Ueuchi et al.
6,014,032 A 1/2000 Maddix et al.
6,025,208 A 2/2000 Chui et al.
6,029,344 A 2/2000 Khandros et al.
6,031,282 A 2/2000 Jones et al.
6,043,563 A 3/2000 Eldridge et al.
6,051,866 A 4/2000 Shaw et al.
6,059,982 A 5/2000 Palagonia et al.
6,064,213 A 5/2000 Khandros et al.
6,072,190 A 6/2000 Watanabe et al.
6,080,603 A 6/2000 Distefano et al.
6,140,219 A * 10/2000 Dennison .................... 438/618
6,174,744 B1 1/2001 Watanabe et al.
6,184,053 B1 2/2001 Eldridge et al.
6,184,576 B1 2/2001 Jones et al.
6,208,024 B1 3/2001 Distefano
6,214,631 B1 4/2001 Burrows et al.
6,221,750 B1 4/2001 Fjelstad
6,235,544 B1 * 5/2001 Franklin et al. ............... 438/14
6,255,126 B1 * 7/2001 Mathieu et al. ............... 438/15
6,268,015 B1 * 7/2001 Mathieu et al. ............... 427/96
6,289,583 B1 9/2001 Belmont et al.
6,307,392 B1 10/2001 Soejima et al.
6,362,520 B2 3/2002 Distefano
6,475,822 B2 11/2002 Eldridge et al.
6,705,876 B2 3/2004 Eldridge
6,713,374 B2 3/2004 Eldridge et al.
6,948,941 B2 9/2005 Eldridge
7,169,646 B2 1/2007 Eldridge
2002/0019152 A1 2/2002 Eldridge et al.
2007/0123082 A1 5/2007 Eldridge

FOREIGN PATENT DOCUMENTS

EP 552003 7/1993
EP 802419 10/1997
JP 58191453 11/1983
JP 60211864 10/1985
JP 61180453 8/1986
JP 6235657 2/1987
JP 228930 1/1990
JP 4245465 9/1992
JP 5018741 1/1993
JP 6018555 1/1994
JP 6260237 9/1994
JP 6260383 9/1994
JP 6267408 9/1994
JP 7021968 1/1995
JP 7333232 12/1995
JP 8015318 1/1996
JP 8021841 1/1996
JP 8306708 11/1996
JP 2001-177146 6/2001
JP 2003-198155 7/2003
JP 2004-7218 1/2004
WO WO 96/37332 11/1996
WO WO 97/43653 11/1997
WO WO 97/44676 11/1997
WO WO 98/01906 1/1998
WO WO 98/45716 10/1998
WO WO 98/52224 11/1998

OTHER PUBLICATIONS

U.S. Appl. No. 09/364,855, filed Jul. 30, 1999, Eldridge et al.
U.S. Appl. No. 08/824,988, filed Mar. 27, 1997, Khandros et al.

* cited by examiner

VARIABLE WIDTH RESILIENT CONDUCTIVE CONTACT STRUCTURES

FIELD OF THE INVENTION

The present invention relates to interconnect assemblies and methods for making and using interconnections and methods for making these interconnect assemblies.

BACKGROUND OF THE INVENTION

There are numerous interconnect assemblies and methods for making and using these assemblies in the prior art. Interconnect assemblies for making electrical interconnections with semiconductor integrated circuits must support the close spacing between interconnect elements, sometimes referred to as the pitch of the interconnect elements. Certain interconnect assemblies perform their functions through testing and the useful life of the integrated circuit. One type of interconnect assembly in the prior art uses a resilient contact element, such as a spring, to form either a temporary or a permanent connection to a contact pad on a semiconductor integrated circuit. Examples of such resilient contact elements are described in U.S. Pat. No. 5,476,211 and also in co-pending, commonly-assigned, U.S. patent application entitled "Lithographically Defined Microelectronic Contact Structures," Ser. No. 09/032,473, filed Feb. 26, 1998, and also co-pending, commonly-assigned, U.S. patent application entitled "Interconnect Assemblies and Methods," Ser. No. 09/114,586, filed Jul. 13, 1998. These interconnect assemblies use resilient contact elements which can resiliently flex from a first position to a second position in which the resilient contact element is applying a force against another contact terminal. The force tends to assure a good electrical contact, and thus the resilient contact element tends to provide good electrical contact.

These resilient contact elements are typically elongate metal structures which in one embodiment are formed according to a process described in U.S. Pat. No. 5,476,211. In another embodiment, they are formed lithographically (e.g. in the manner described in the above-noted patent application entitled "Lithographically Defined Microelectronic Contact Structures"). FIG. 1A illustrates an example of resilient contact elements which are formed using a technique described in U.S. Pat. No. 5,476,211. FIG. 1B shows an example of a resilient contact element which is formed using lithographic techniques such as those described in the above-noted U.S. patent application entitled "Lithographically Defined Microelectronic Contact Structures." In general, resilient contact elements are useful on any number of substrates such as semiconductor integrated circuits, probe cards, interposers, and other electrical assemblies. For example, the base of a resilient contact element may be mounted to a contact terminal on an integrated circuit or it may be mounted onto a contact terminal of an interposer substrate or onto a probe card substrate or other substrates having electrical contact terminals or pads. The free end of each resilient contact element can be positioned against a contact pad on another substrate to make an electrical contact through a pressure connection when the one substrate having the resilient contact element is pressed towards and against the other substrate having a contact element which contacts the free end of the resilient contact element.

It will be appreciated that in certain instances, it may be desirable to secure the free end to the corresponding contact element by an operation such as soldering. However, in many instances, it is appropriate to allow the contact to be made by pressure between the two substrates such that the contact end of the resilient contact element remains free.

The resilient contact elements are useful for making electrical contacts because their resilience maintains pressure for good electrical contact and because they allow for tolerance in the vertical or Z direction such that all contact elements will be able to make a contact even if their heights vary slightly. However, this pressure sometimes leads to the deformation or degradation of resilient contact elements as they are compressed too much in the vertical direction. One approach to prevent the deformation or degradation of such resilient contact elements is to use a stop structure on one or both of the two substrates. The stop structure effectively defines the maximum deflection of the resilient contact element such that each of the resilient contact elements is prevented from overflexing (undue deflection) or being destroyed as a result of the two substrates being pressed toward each other. FIG. 1A shows an example of an integrated circuit having contact pads 103 and having, for each of the contact pads, a resilient contact element 110 mounted thereto. A plurality of stop structures 104 and 105 are disposed on the surface of the integrated circuit 102. These stop structures will prevent undue deflection and may engage another substrate which is pressed towards the surface of the semiconductor integrated circuit 102.

FIG. 1B shows an example of a lithographically defined resilient contact element on a substrate, such as a semiconductor integrated circuit 120. The integrated circuit includes on its surface a stop structure 150.

The lithographically defined resilient contact structure of FIG. 1B includes an intermediate layer 123 which makes an electrical interconnection with the pad 122 through an opening in the passivation layer 121 on the surface of the substrate of the integrated circuit 120. A first metal layer 125 and a second metal layer 126 are then formed to create a beam having a step 128 and a beam portion 127. In this example, the beam portion is substantially parallel to the surface of the substrate 120. A tip structure including components 181, 182, 183, 184, and 185 is then subsequently mounted to the end of the beam 127 to create a resilient contact structure. Further details concerning methods for creating and using such lithographically defined resilient contact structures are described in the co-pending U.S. patent application entitled "Lithographically Defined Microelectronic Contact Structures" which is referred to above and which is hereby incorporated herein by reference. While this lithographically defined resilient contact element provides the advantage that it can be formed lithographically using modern photolithographic techniques which are prevalent in the semiconductor industry, there are certain disadvantages with this type of resilient contact element. For example, when a force F as shown in FIG. 1B is applied downwardly against the tip 185, a torqueing action occurs at the base of the resilient contact element. This torqueing action results from the pressure contact which occurs when a contact element on another substrate is pressed towards the tip 185. This torque at the base tends to place stress at the base and along the beam portion. If the beam portion 127 is a rectangular shape, this results in the stress being localized at the portion of the beam which is next to the base of the resilient contact element. While the stop structure 150 provides some assurance that certain levels of stress will not be exceeded, there are still certain concentrated areas of stress, as a result of the rectangular shape, which must be accounted for when designing a resilient contact element. Typically, accounting for these concentrated areas of stress requires increasing the use of the amount of materials at certain points in the resilient contact element. This in turn may limit the ability to design resilient contact elements to be smaller. This is particularly undesirable as the sizes of structures on semiconductor integrated circuits are being reduced over time.

Thus, it is desirable to provide an improved resilient contact element.

SUMMARY OF THE INVENTION

The present invention provides an interconnect assembly and methods for making and using the assembly. In one example of the present invention, an interconnect assembly includes a substrate and a contact element disposed on the substrate. A first portion of the contact element is adapted to be free-standing and is further adapted to be capable of moving from a first position to a second position when a force is applied to the first portion of the contact element. The interconnect assembly further includes a stop structure which is disposed on a second portion of the contact element. The stop structure defines in part the second position of the contact element. In one particular exemplary embodiment of the present invention, the substrate comprises a semiconductor integrated circuit. Force is applied when another contact element is brought into mechanical and electrical contact with the contact element. The stop structure defines the second position which defines a maximum flexing of the contact element.

According to another example of the present invention, an interconnect assembly is formed by a method of disposing a contact element on a substrate, where a first portion of the contact element is free-standing and is capable of moving from a first position to a second position when a force is applied to the first portion of the contact element. The method also includes disposing a stop structure on a second portion of the contact element, where the stop structure defines the second position.

It will be appreciated that a plurality of contact elements of the invention may be used to create an interconnect assembly.

An example of a method according to another aspect of the present invention involves the formation of a freestanding elongate resilient contact element using a mold. In this method, a mold is depressed into a deformable material; the mold determines a shape of at least a portion of the freestanding elongate resilient contact element. This portion of the freestanding elongate resilient contact element is then formed on the deformable material.

Various other assemblies and methods are described below in conjunction with the following figures.

BRIEF DESCRIPTION OF THE DRAWINGS

The present invention is illustrated by way of example and not limitation in the figures of the accompanying drawings in which like references indicate similar elements.

FIG. 1A is a perspective view of the substrate 102 with its resilient contact elements and stop structures.

FIG. 1B is a cross-sectional view of the resilient contact element and the stop structure.

DETAILED DESCRIPTION

The present invention relates to interconnection assemblies and methods and particularly to interconnect assemblies and methods for making mechanical and electrical connection to contact elements on an integrated circuit. The following description and drawings are illustrative of the invention and are not to be construed as limiting the invention. Numerous specific details are described to provide a thorough understanding of the present invention. However, in other instances, well known or conventional details are not described in order to not unnecessarily obscure the present invention in detail.

Figure 1A:
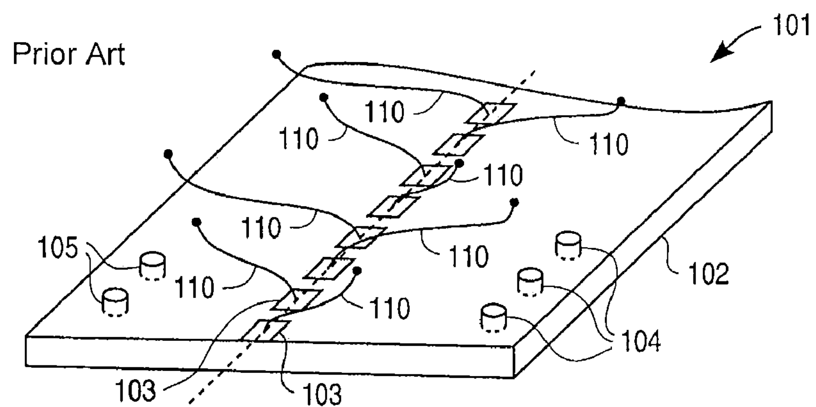
FIG. 1A shows an example of a plurality of resilient contact elements disposed on a substrate with stop structures on that substrate.
Figure 1B:
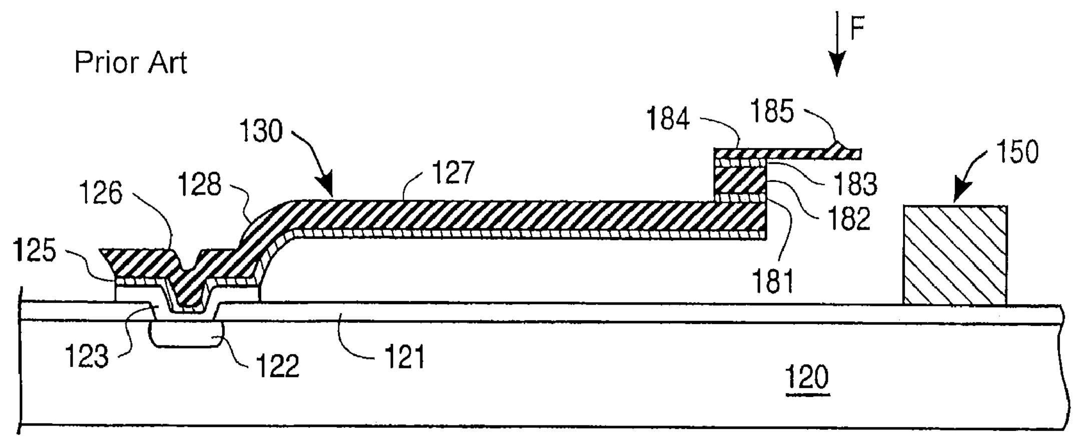
FIG. 1B shows an example of a lithographically formed resilient contact element formed on a substrate with a stop structure.
Figure 2A:
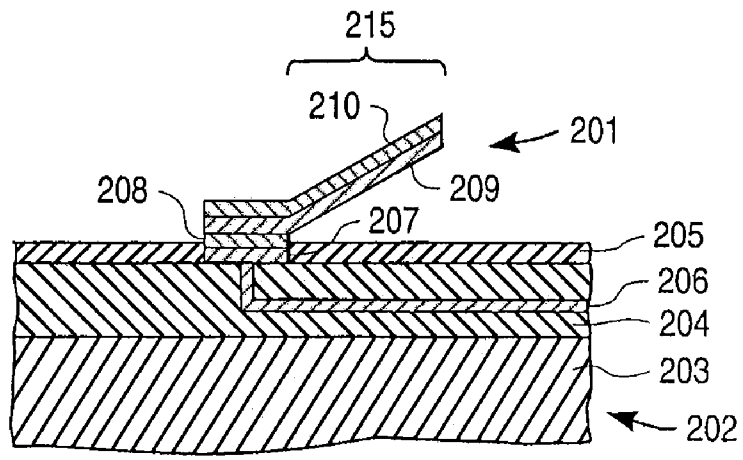
FIG. 2A is a cross-sectional view of a resilient contact element according to one embodiment of the present invention.

FIG. 2A shows a cross-sectional view of a resilient contact element which is one example of an embodiment of the present invention. The resilient contact element 201 of FIG. 2A includes a first metal layer 209 and a second metal layer 210 which have been formed at an oblique angle relative to the surface of the substrate 202. The first metal layer 209 may be selected for its resiliency properties in order to impart resiliency to the resilient contact element and the second metal layer 210 may be selected for its electrical conductivity properties in order to provide good electrical conductivity for the resilient contact element. The substrate 202 is typically a semiconductor substrate which includes an integrated circuit which includes various terminals, one of which is shown as the contact pad 207 in FIG. 2A. Representative terminals carry input/output signals, power or ground. This contact pad 207 is coupled through a wiring layer 206 to internal circuitry within the integrated circuit. The wiring layer 206 is disposed within an insulating layer 204, and layers 206 and/or 204 may be covered by a passivating layer 205 on the top surface of the substrate 202. The layer 203 may be an insulating layer or a polysilicon layer or other layers which are known and used in integrated circuits. The contact pad 207 is electrically and mechanically coupled to a shorting layer 208 which is disposed above the contact pad 207. The metal layers 209 and 210 are formed above the shorting layer 208 with a base portion of each of the metal layers 209 and 210 above and electrically connected to contact pad 207. Electrical conductivity between the contact pad 207 occurs through the shorting layer 208 and the metal layer 209 and finally to the metal layer 210. It will be appreciated that the resilient contact element 201 of FIG. 2A may also be used for other types of interconnect assemblies such as probe card assemblies or interposers or other connection systems where a resilient contact element may provide electrical conductivity from a conductor in the substrate 202 to the tip, which is free-standing, of the resilient contact element 201. As can be seen from FIG. 2A, this resilient contact element is both free-standing and elongate. Also, the resilient contact element, in the embodiment shown in FIG. 2A, is sloped relative to the surface of the substrate 202. In a preferred embodiment, this slope typically forms an oblique angle relative to the surface of the substrate 202.

In one particular embodiment of the present invention, the resilient contact element 201 may be formed such that the beam portion which extends from the base has a substantially triangular shape. This is shown in the top view of the resilient contact structure 301 shown in FIG. 3A. That is, the beam portion 215 of the resilient contact element 201 may be formed in such a way as to have a substantially triangular shape such as the beam portion 303 of the resilient contact element 301 shown in FIG. 3A. The resilient contact element 301 includes a base 302 which is attached to the beam portion and a tip 304 which makes electrical contact with another interconnect terminal/pad. FIG. 3B shows, in a top view, another example of a resilient contact element 301A which has a beam portion 303A which has a substantially triangular shape. The beam portion 303A is attached to the base 302A and includes a tip 304A.

Figure 2B:
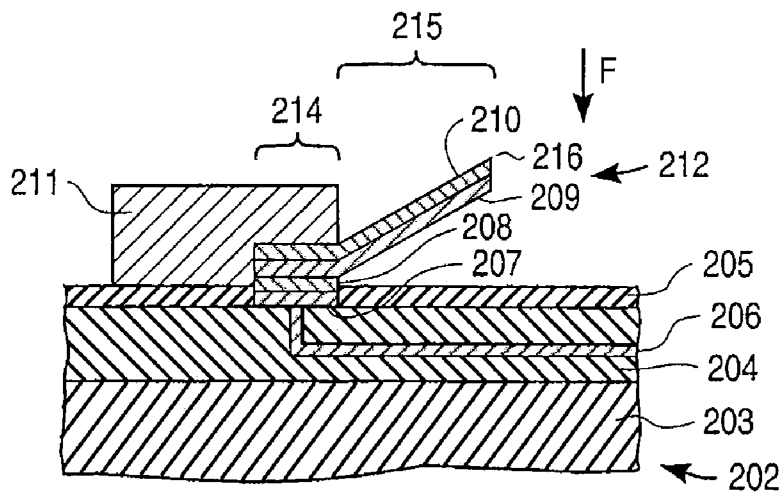
FIG. 2B is a cross-sectional view of another embodiment of a resilient contact structure of the present invention with a stop structure disposed over a base of the resilient contact element.

FIG. 2B shows another embodiment of the present invention in which a stop structure 211 is disposed on the top surface of the substrate 202 and is also disposed on top of a portion of the base 214 of the resilient contact element 212. In this embodiment shown in FIG. 2B, the substrate 202 includes the similar components 203, 204, 205, 206, 207, 208, 209 and 210 as in the case of the interconnect assembly shown in FIG. 2A. A resilient contact element 212 includes two metal layers 209 and 210 which have been formed such that a base portion 214 of both metal layers rests on the upper surface of the shorting layer 208 while beam portion 215 extends from an end of the base portion 214 at an oblique angle relative to the surface of the substrate 202. The beam portion of the resilient contact element 212 may have a triangular shape or other shapes such as rectangular shapes or other shapes which are known to be used for resilient contact elements. In one embodiment, however, it is preferred that the beam 215 have a triangular shape such as the beam 303 of FIG. 3A or beam 303A of FIG. 3B. The stop structure 211 is formed over the base portion 214 of the resilient contact element 212. The stop structure 211 acts to prevent overflexing (e.g. undue deflection) of the resilient contact element by determining the maximum amount of deflection of the resilient contact element 212 as it is pressed by a force F towards the surface of the substrate 202. When another contact element, such as a contact pad on another substrate, is pressed toward and against the tip 216 of the resilient contact element 212, the upper surface of the stop structure 211 will engage a corresponding surface of the other substrate to prevent the substrate from being pressed further towards the surface of the substrate 202. That is, the travel between the two substrates is limited by the stop structure 211 such that the stop structure 211 will define or determine a minimum distance between the substrates and hence a maximum flexing of the resilient contact element 212. Further details in connection with advantages of and uses of stop structures are described in co-pending U.S. patent application Ser. No. 09/032,473, which was filed Jul. 13, 1998 and is entitled "Interconnect Assemblies and Methods;" this co-pending patent application entitled "Interconnect Assemblies and Methods" is hereby incorporated herein by reference.

Figure 2C:
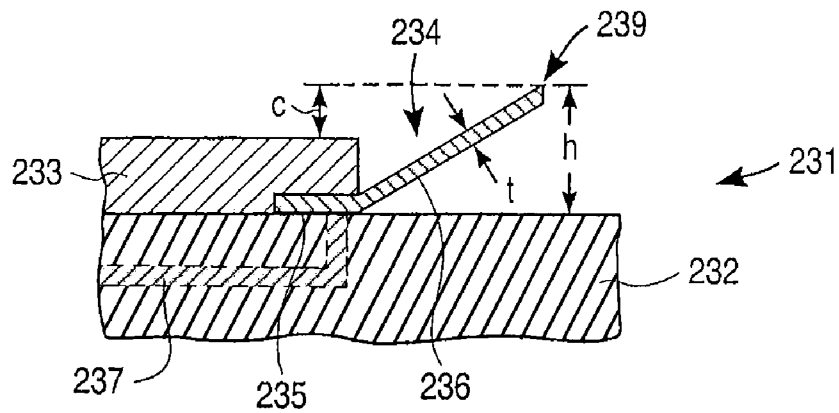
FIG. 2C shows a cross-sectional view of another example of an embodiment of a resilient contact element according to the present invention in which a stop structure is disposed over a base of the resilient contact element.
Figure 4:
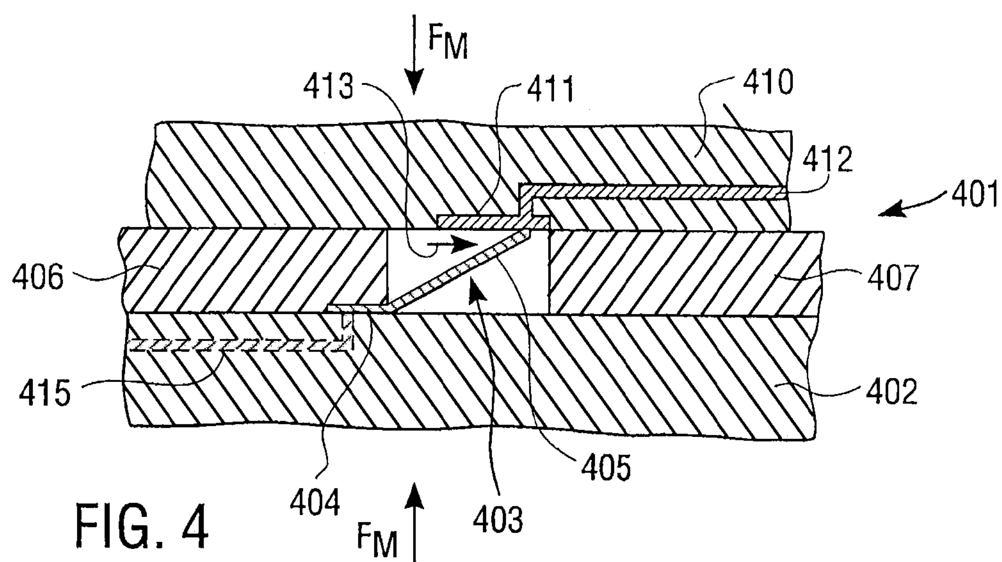
FIG. 4 shows, in cross-sectional view, an example of an interconnect assembly of the present invention which includes a resilient contact element having a stop structure disposed over the base of the contact element and FIG. 4 also shows another substrate being brought into contact with the substrate carrying the stop structures and the resilient contact element.

FIG. 2C shows a simplified example of a resilient contact structure with a stop structure according to one exemplary embodiment of the invention. The interconnect assembly 231 includes a substrate 232 which has a wiring layer 237 embedded therein. The wiring layer 237 is electrically coupled to a base portion 235 of a resilient contact element 234. The base portion 235 is coupled to the beam portion 236. Typically, as described below, the beam portion 236 and the base portion 235 are formed integrally in one operation. Both the base portion 235 and the beam portion 236 may contain multiple conductive layers such as the layers 208, 209, and 210 as shown in FIGS. 2A and 2B. As in the case of the embodiments shown in FIGS. 2A and 2B, the beam portion 236 of the resilient contact element 234 extends from an end of the base portion 235 at an oblique angle relative to the surface of the substrate 232. The stop structure 233 is disposed above and adhered to the surface of the substrate 232 and it is also disposed above and adhered to the top surface of the base portion 235. As shown in FIG. 2C, an end of the wiring layer 237 is mechanically adhered to and electrically coupled to the base portion 235. Since the stop structure 233 is mechanically adhered to the top surface of the substrate 232 and to the top surface of the base portion 235, any torque created at the base portion 235 (e.g. as a result of a force exerted against the tip of the beam portion 236 when a contact pad, such as the contact pad 411 shown in FIG. 4, is pressed towards the surface of the substrate 232) will be balanced through various parts of the entire structure, including the stop structure 233, rather than merely the base portion 235 and the beam portion 236. It will be appreciated that, in an alternative embodiment, a stop structure may be disposed on only the base portion 235 and not the substrate 232 and that this stop structure will tend to balance any torque created at the base portion.

Figure 3A:
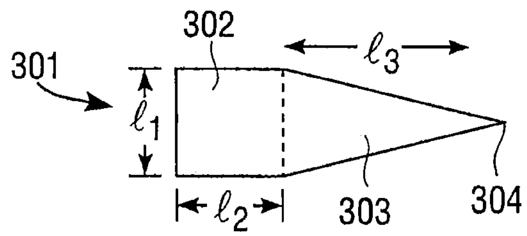
FIG. 3A is a top view of one example of a resilient contact element according to the present invention.
Figure 3B:
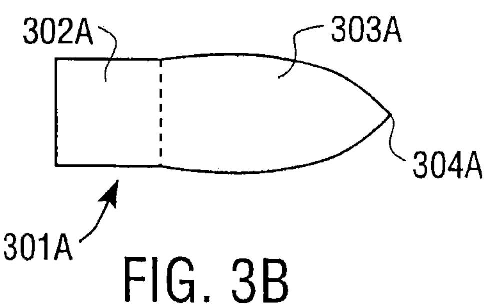
FIG. 3B is a top view of another example of a resilient contact element according to the present invention.

Several dimensions are labeled in FIG. 2C and also FIG. 3A in order to provide examples of the present invention. It will be appreciated that the following examples are merely illustrative of the invention and are not intended to limit the invention and are not intended to provide an exhaustive set of examples for possible structures which are within the scope of the present invention. The distance c represents in one example (e.g. see FIG. 4) the maximum displacement or deflection of the resilient contact element. In one example, this is approximately 75 microns (about 3 mils). This distance c is normally less than the element's compliance which is the total amount of deflection or flexing which is available before "failure" of the resilient contact element. This distance in one example (e.g. see FIG. 4) represents the travel of the tip from a point where there is no force pressing against the tip to the point where the tip has been pressed flush with the top surface of the stop structure 233. Examples of these two states are shown in FIG. 2C where no force is being applied to the tip and FIG. 4 where a force has been applied to the tip such that one substrate 410 has its surface virtually in contact with the top surface of the stop structures 406 and 407.

The thickness t represents the total thickness of the resilient contact element in a perpendicular cross-section of the resilient contact element as shown in FIG. 2C. Typically, this thickness will be approximately the same throughout any particular cross-section, although it will be appreciated that in alternative embodiments, this thickness may be different at certain cross-sections. It will also be appreciated that FIG. 2C represents a simplified example of a resilient contact element 234 and that the base and the beam portions may be fabricated from one or more conductive layers. In a typical embodiment, the thickness is approximately 25 microns, and the total height h of the resilient contact element 234 is approximately 150 microns (about 6 mils).

For certain embodiments, the spring rate of the resilient contact element may be approximately 1 to 2 grams per mil, where the spring rate "k" represents the force of the spring divided by the displacement of the spring (k=F/x). It will be appreciated that once the geometry and the materials have been selected for a particular resilient contact element, the thickness of the spring generally determines the spring rate. Thickness is a major factor in determining the stress at a maximum deflection, which is also dependent upon the material in the resilient contact element. It will be appreciated that certain design points or goals will be established for a resilient contact element such that the maximum possible stress for the resilient contact element is less than a desired amount. The use of the stop structure 233 will tend to control the maximum amount of stress and also tend to relieve the stress at maximum deflection by counteracting the torque at the base portion of the resilient contact element. This can be seen from FIG. 4 which will be further described below.

Figure 2D:
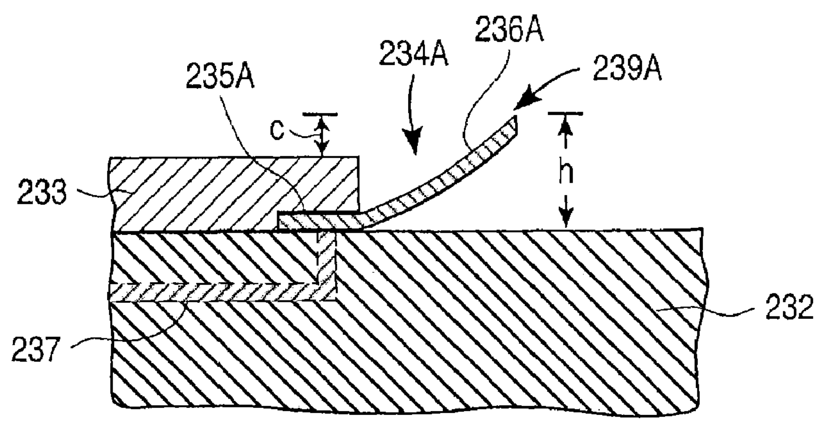
FIG. 2D shows a cross-sectional view of another example of a resilient contact element of the present invention.

The resilient contact element may have a curved shape which provides certain advantages that are described here in conjunction with FIGS. 2D, 2E, 2F, 2G and 2H. FIG. 2D shows a cross-sectional view of a curved resilient contact element 234A which includes a base portion 235A, a tip 239A and a curved beam portion 236A. The base portion 235A is coupled electrically to the wiring layer 237. The curvature of the beam portion may be used to compensate for bending of the beam portion during deflection of the resilient contact element. This compensation is shown in the comparison shown by FIGS. 2E, 2F, 2G and 2H.

A stop structure 233 is disposed on the base portion 235A and (optionally) on the substrate 232.

Figure 2E:
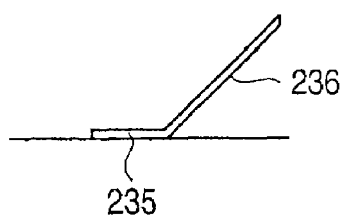
FIGS. 2E, 2F, 2G, and 2H show cross-sectional views which compare the deflection of an initially straight resilient contact element, shown in FIG. 2E, to the deflection of an initially curved resilient contact element shown in FIG. 2G.
Figure 2F:
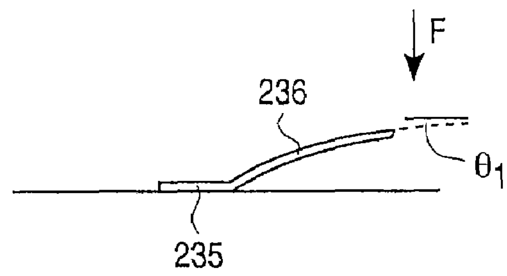

FIGS. 2E and 2F respectively show an initially straight resilient contact element before and after deflection of the resilient contact element. When a force F is applied to the tip of the beam portion 236, the beam portion curves as shown in FIG. 2F, and this causes the tip to be tilted away from the surface of the contact point on the other substrate and causes a shallow angle $\theta_1$ to be formed between a line representing the surface of the contact point and a line through the end of the beam portion. These lines are shown in FIG. 2F along with the angle θ. The shallowness of this angle tends to be undesirable for making a good electrical connection.

Figure 2G:
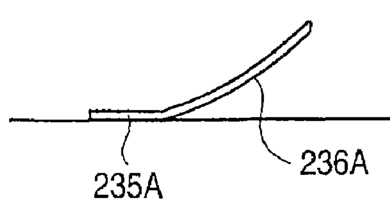
Figure 2H:
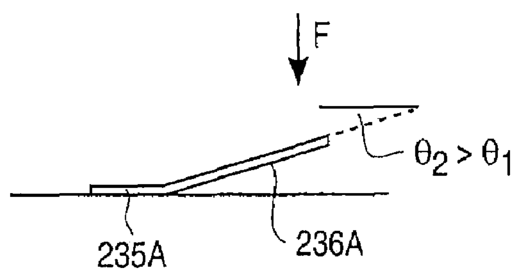

FIGS. 2G and 2H respectively show an initially curved resilient contact element before and after deflection of the resilient contact element. When the force F is applied to the tip of the beam portion 236A, this beam portion tends to be straightened out as shown in FIG. 2H. As a result of this straightening out, the angle $\theta_2$ (the angle between the line representing the surface of the contact point and a line through the end of the beam portion) is not as shallow as angle $\theta_1$ and thus better electrical contact may be accomplished using the curved resilient contact element.

FIG. 3A and FIG. 3B show another aspect of the present invention in which the beam portion of the resilient contact element has a substantially triangular shape. The resilient contact element 301 includes a base 302 which corresponds to the base 235 in FIG. 2C. The beam portion 303 shown in the top view of FIG. 3A corresponds to the beam portion 236 of FIG. 2C. The beam portion 303 includes a tip 304 which corresponds to the tip 239 of the resilient contact element 234 of FIG. 2C. The triangular shape of the beam portion 303 tends to more evenly distribute across (e.g. tip to base) the entire beam the stress created when the tip 304 is pressed towards the surface on which the base 302 is resting. This allows the use of less material in the beam 303 while still obtaining good performance for the resilient contact element, such as the ability to withstand continued stress throughout the useful life of the resilient contact element. FIG. 3B shows an alternative triangular shaped resilient contact element.

Figure 3C:
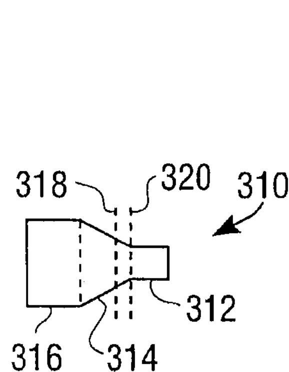
FIG. 3C is a top view of another example of a resilient contact element according to the present invention.

FIG. 3C shows, in top view, another example of a resilient contact element 310 which has a substantially triangular shape. In this case, the triangle is modified at the electrical contact end 312 to include a portion of a rectangle. The beam portion of the resilient contact element 310 is normally freestanding and capable of deflections when depressed and includes a triangular part 314 and a rectangular part 312. The triangular part is attached to the base portion 316. The beam portion may be attached to the base portion 316 at an oblique angle and may be lithographically formed together with the base portion 316. It can be seen that the cross-sectional areas taken at different cross-sections 318 and 320 will be different, and this is also true of the contact elements 301 and 301A.

Figure 3D:
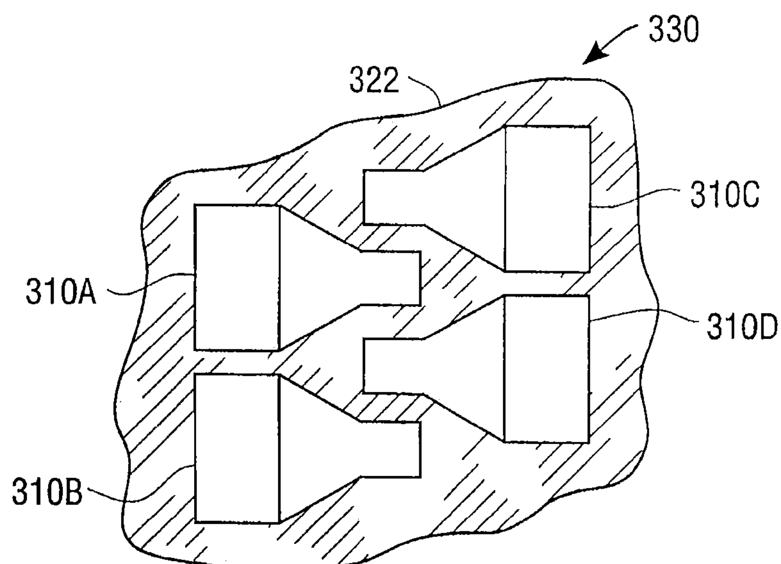
FIG. 3D shows, in top view, an array of resilient contact elements disposed on a substrate.

The geometry of the beam portions of these substantially triangular shaped resilient contact elements provides improved performance over a cantilever beam spring which has a substantially constant cross-sectional area. Other shapes may also be selected to provide improved performance relative to cantilever beam springs which have substantially constant cross-sectional areas. The substantially triangular shape gives better behavior of the spring under stress and allows for tighter packing (small pitches) for the springs. FIG. 3D shows an array of tightly packed (e.g. pitch of 10 microns) resilient contact elements 310A, 310B, 310C and 310D of the type shown in FIG. 3C on a substrate 322 (which may be an integrated circuit or an electrical connection substrate which may be used to test or make permanent contact to an integrated circuit). The geometry of the beam portion is selected to give optimum stress behavior for a given size constraint (e.g. the size as determined by the packing of the contact elements) and a given spring rate and a given/desired amount of compliance for the contact element. A smaller size, as determined by a size constraint, for a given spring rate and given compliance tends to place greater stress at certain points of a cantilever beam having a constant cross-sectional area. A substantially triangular shaped resilient contact element, on the other hand, allows for tighter packing (see, e.g. FIG. 3D) and smaller sizes while, for the same spring rate and given compliance, allowing better behavior under stress.

In a typical embodiment, the dimensions $l_1$ and $l_2$ are about 9 mils while the dimension $l_3$ is about 27 mils. An array of these resilient contact elements may be formed on a substrate, such as an integrated circuit or a contactor for making contact to an integrated circuit, to create a densely packed array of such resilient contact elements. FIG. 8B shows one example of a layout of an array on a substrate 803. In one embodiment, these resilient contact elements may be packed so densely that the distance between corresponding points (e.g. bases) on adjacent contact elements is less than 30 mils and even as small as 0.1 mils (approximately 2.5 microns). FIG. 3D shows another example of an array of densely packed (tight pitch) resilient contact elements.

The actual use of an interconnect assembly according to one embodiment of the present invention will now be described while referring to FIG. 4. The substrate 402 includes a resilient contact element 403 having a beam portion 405 and a base portion 404. In this particular embodiment, the beam portion 405 may have a triangular shape or may have another shape such as a rectangular shape. Two stop structures 406 and 407 are adhered to the upper surface of the substrate 402 and the stop structure 406 is also adhered to the top portion of the base 404. The base 404 makes mechanical and electrical contact with the wiring layer 415 in the substrate 402. It will be appreciated that the substrate 402 may be a semiconductor integrated circuit or may be a passive wiring layer such as a probe card or interposer structure. Another interconnection assembly 410 having a contact pad 411 is brought into electrical and mechanical contact with the tip of the beam portion 405 as shown in FIG. 4. The entire assembly 401, which includes substrates 410 and 402, is pressed together to assure a good pressure connection between the tip of the beam portion 405 and the surface of the contact pad 411. The contact pad 411 makes electrical contact with other components through the wiring layer 412 of the substrate 410. As the substrate 410 is pressed towards the substrate 402, the tip of the beam portion 405 makes a wiping action which occurs laterally along the direction of the arrow 413 as shown in FIG. 4. This improves the electrical contact between the beam portion 405 and the pad 411, thus improving the electrical contact between the wiring layers 415 and 412. It will be appreciated that FIG. 4 illustrates the circumstance where the substrate 410 is pressed completely against the substrate 402 and thus no further "travel" is possible (they cannot get closer). This represents the maximum deflection of the resilient contact element 403. However, in use of the assembly 401, the two substrates may not be abutting such that the resilient contact element 403 is deflected less than the maximum deflection while still achieving acceptable electrical conductivity between the beam 405 and the pad 411. The final assembly of substrates 402 and 410 may be held in place by various techniques (with either maximum deflection of the resilient contact elements or less than maximum deflection) including by mechanical forces (e.g. $F_m$ shown in FIG. 4) and/or by an adhesive applied between the surface of substrates 402 and 410 (not shown).

A method of fabricating an interconnect assembly will now be described; this method represents one particular example of the present invention and it will be appreciated that various other methods may be employed using alternative techniques and procedures. The method 500 shown in FIG. 5 begins with the operation 502. This particular method assumes that a redistribution layer will be applied in order to redistribute contact pads having a certain arrangement and geometry to a set of another contact pads having a different arrangement and/or geometry. It will be appreciated that in other circumstances, a redistribution layer may not be necessary, and the contact elements of the invention may terminate directly on the wiring layers of the substrate without a redistribution layer; see FIG. 6E. In operation 502, a passivation layer, such as a polyimide layer, is applied to the upper surface of the substrate having a contact pad disposed on the upper surface. In one embodiment, a polyimide layer may be spun onto the upper surface to uniformly cover the surface. Then the passivation layer is patterned using conventional photolithography to create openings in the passivation layer over the contact pads at the surface of the substrate. These contact pads may be input/output interconnections in a semiconductor integrated circuit or they may be contact terminals on a passive or active board or substrate such as a probe card or an interposer or other interconnect assemblies.

Figure 6A:
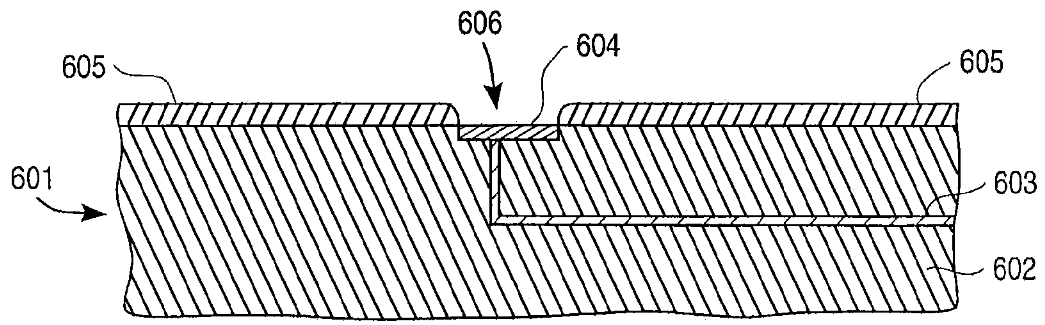
FIG. 6A shows a cross-sectional view of the structure of an interconnect assembly during the formation of a resilient contact element according to one method of the present invention.

FIG. 6A shows an example of an interconnect assembly 601 having a contact 604 at the upper surface of the substrate 602. A wiring layer 603 is disposed in the substrate 602 in order to provide electrical conductivity between the pad 604 and another component, such as a circuit within the substrate 602 or a contact terminal at another location on the substrate 602. It will be appreciated that typically the wiring layer 603 is disposed within an insulating layer in the substrate 602. It will also be appreciated that the portion shown in FIG. 6A is the upper portion of the substrate 602 and that other wiring layers and/or circuitry is disposed below this portion shown in FIG. 6A. The passivation layer applied in operation 402 is shown as passivation layer 605 in FIG. 6A. This passivation layer has been patterned to create an opening 606 over the contact pad 604.

Figure 5:
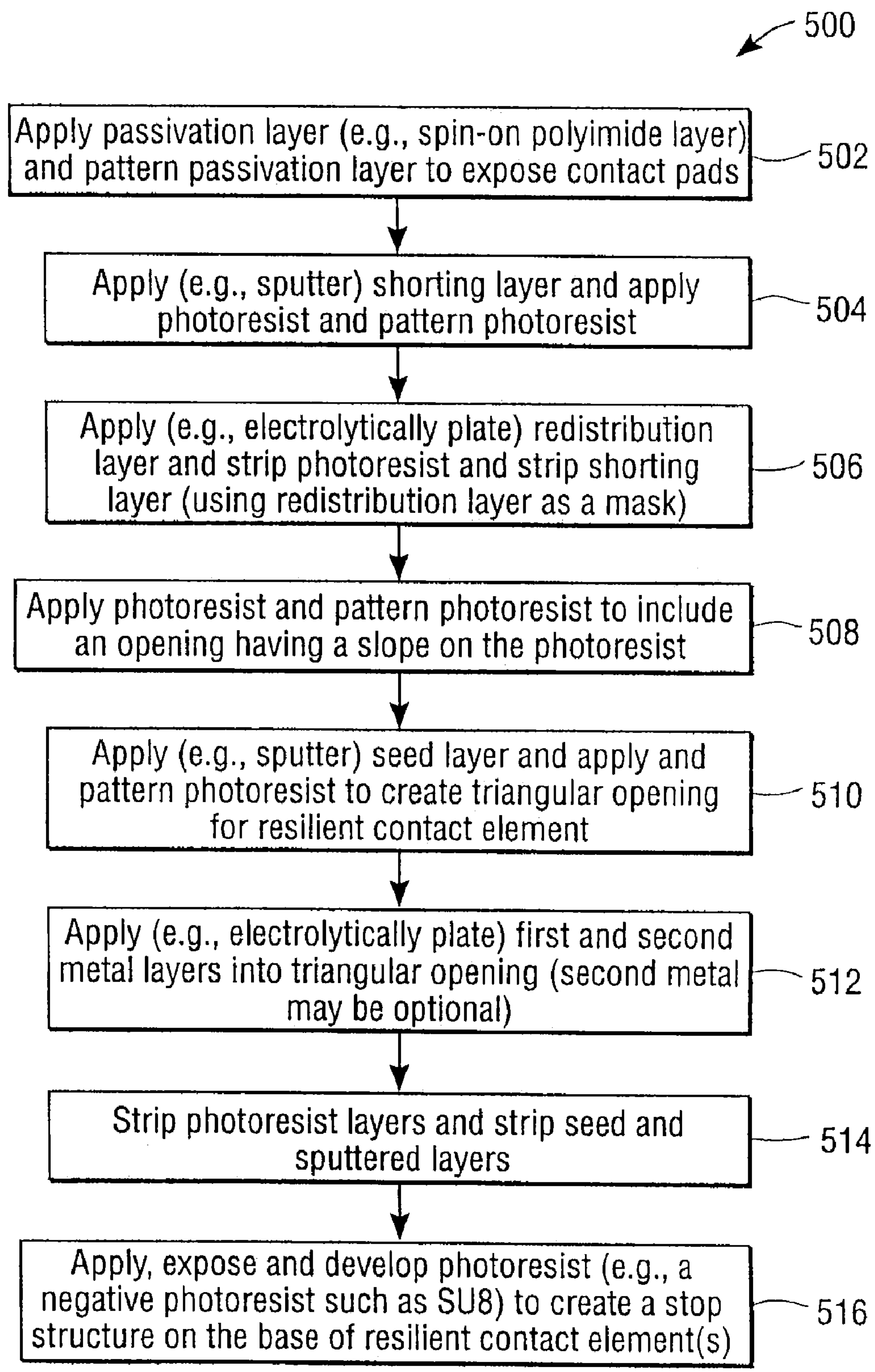
FIG. 5 is a flowchart showing an example of a method for forming a resilient contact element and a stop structure according to one embodiment of the present invention.
Figure 6B:
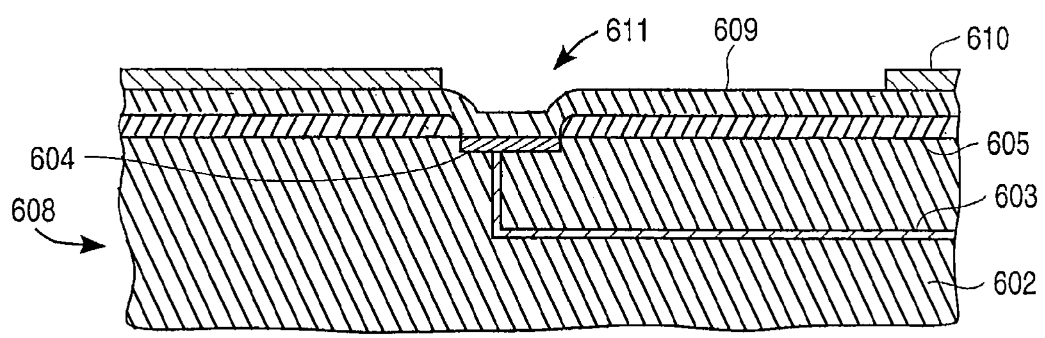
FIG. 6B shows another cross-sectional view at a later processing stage in the fabrication process which produces a resilient contact element according to one embodiment of the present invention.
Figure 6C:
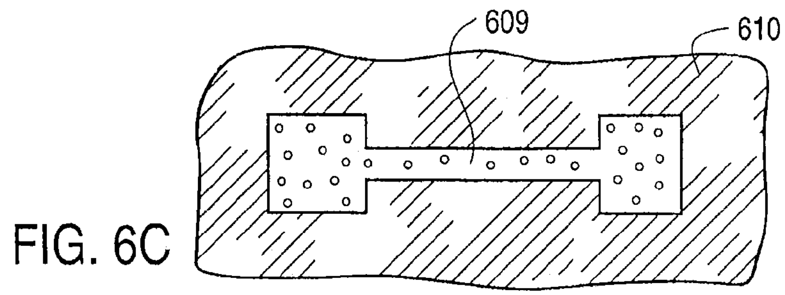
FIG. 6C shows a top view of a portion of the structure 608 shown in FIG. 6B.

In operation 504 of FIG. 5, a shorting layer is applied over the surface of the passivating layer 605 and over the surface of the contact pad 604. Then, a conventional photoresist is applied over the entire surface of the shorting layer and this photoresist is patterned using conventional photolithography to create an opening over the shorting layer. The shorting layer may be formed from copper, titanium, or titanium/tungsten or other appropriate metallization and may be sputtered onto the surface of layer 605. An example of a resulting interconnect assembly after operation 504 is shown in FIG. 6B. The interconnect assembly 608 of FIG. 6B includes a shorting layer 609 which is disposed above the passivation layer 605 and the contact pad 604. The contact pad and the shorting layer 609 are in electrical conductivity. The patterned photoresist layer 610 includes an opening 611 over a portion of the shorting layer. This opening will be used to create a redistribution layer wherein the layout of the contact pad 604 will be redistributed to another location. This may be done to relax the interconnection pitch achieved at the end of the process when the resilient contact elements have been formed on the substrate 602. FIG. 6C shows a top view of the redistribution wiring layer. In particular, FIG. 6C shows the pattern in the photoresist layer 610 which has created a hole in the patterned photoresist 610. This hole exposes a portion of the shorting layer 609 as shown in FIG. 6C.

In operation 506 of FIG. 5, a redistribution layer is applied over the shorting layer. This redistribution layer may be applied by electrolytically plating (or electroless plating) a metal layer (e.g. copper or gold) onto the exposed portion of the shorting layer, where the shorting layer is used as the cathode in an electrolytic plating operation. It will be appreciated that on a typical substrate there will be many such redistribution traces created on the surface of the substrate in each of the patterned openings in the patterned photoresist 610.

Figure 6D:
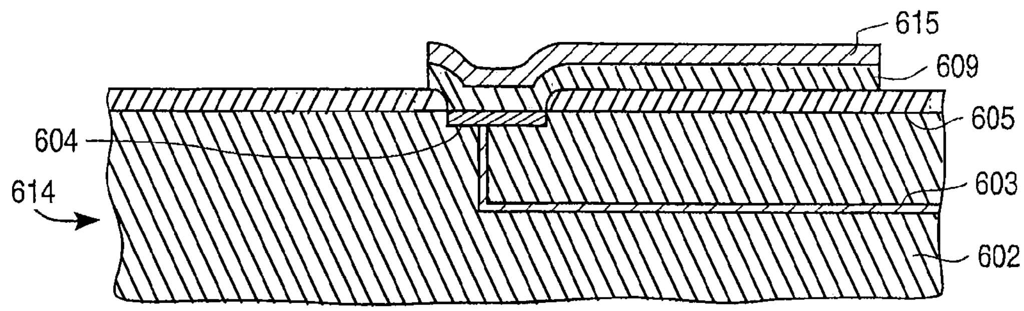
FIG. 6D shows a cross-sectional view of the structure which results after several processing steps shown in FIG. 5.

After the redistribution layer has been applied, the patterned photoresist layer 610 is removed and the shorting layer which is exposed after removing the patterned photoresist layer is also removed. The redistribution layer may be used as a mask to remove the shorting layer. Thus, in this case, typically one metal (e.g. Ti/W) will be used to create a shorting layer and another metal (e.g. Cu) will be used to create the redistribution layer such that the redistribution layer will remain intact while the shorting layer is etched away or removed under the action of a solvent or etching agent which is resisted by the redistribution layer metal. The result of operation 506 is shown in FIG. 6D. It can be seen that the patterned photoresist layer 610 has been removed and that the unprotected portion of the shorting layer 609 has also been removed, leaving the structure of the interconnect assembly 614 shown in FIG. 6D. In an alternative embodiment in which the shorting layer 609 is required for subsequent electrolytic plating (e.g. because layer 642 has electrically isolated regions due to openings in the layer), then the shorting layer 609 is not removed in operation 506 but is removed in operation 514.

Figure 6E:
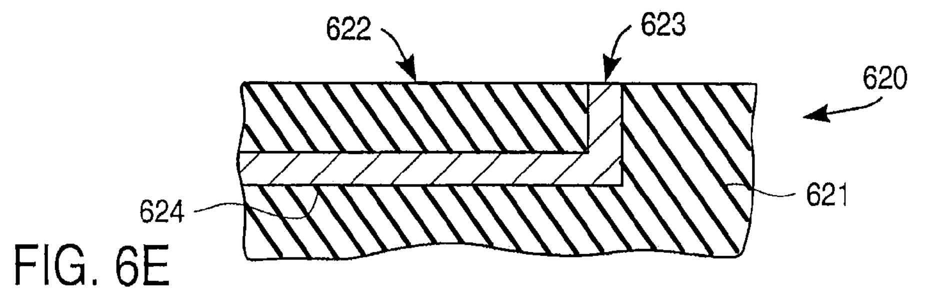
FIG. 6E shows a cross-sectional view of an alternative substrate onto which a resilient contact element of the present invention may be formed.

It will be appreciated that operations 502, 504, and 506 have been used to create a plurality of redistribution traces, such as a redistribution layer, on the surface of the substrate 602. This may be required in certain cases where the contact pads were designed to be connected to an interconnect mechanism other than a resilient contact element or it may be desirable for other reasons. It will also be appreciated that in certain instances, no such redistribution layer is necessary and thus a resilient contact element may be fabricated on a via or other contact element on the surface of a substrate. An example of a via is shown in FIG. 6E in which a post 623 of conductive material is exposed at the upper surface 622 of the substrate 621. This conductive post 623 is electrically coupled to the wiring layer 623 which is also in the substrate 621. Typically, the material encasing the wiring layer 624 and the post 623 is an insulating layer. The substrate 621 will typically be a part of a semiconductor integrated circuit although other interconnect assemblies may also be used, such as printed wiring substrates, interposers, etc. The processing from the structure 620 shown in FIG. 6E is similar to the processing of the structure 614 shown in FIG. 6D from steps 508 through 516 of FIG. 5. That is, while the structure 620 does not need to be processed in operations 502, 504, and 506, it may be processed with operations 508, 510, 512, 514, and 516 as will structure 614 shown in FIG. 6D.

Figure 6F:
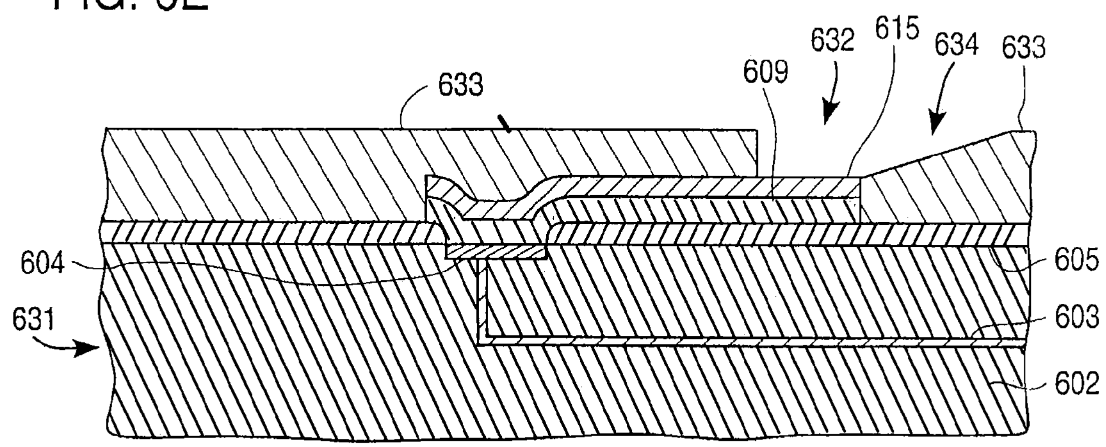
FIG. 6F shows a cross-sectional view after certain processing steps in the method of FIG. 5.

The next operation in the method 500 is operation 508 in which a photoresist is applied and patterned to include an opening which has a slope on the photoresist. The resulting structure of the interconnect assembly is shown as structure 631 in FIG. 6F. The photoresist 633 has been applied and patterned to create an opening 632 which has a slope 634 on a portion of the opening. The opening is disposed at least partially over a portion of the conductive layer 615. It will be appreciated that typically, the flat portion of this opening will be utilized to construct a base for the resilient contact element while the sloped portion 634 will be used to construct the beam portion of the resilient contact element.

There are numerous techniques known in the art for creating openings in photoresist which include a slope on the photoresist. For example, a gray-scale mask having a relatively continuous gradient of opacity from clear to black may be used to create a slope on the photoresist. Other methods may be used to provide the tapered side wall, which include: gently reflowing the masking material to taper a side of the opening; controlling the light exposure intensity or time to the masking material; during exposure, varying the distance of the mask from the masking layer; exposing the masking layer two or more times, one through the mask having a small transparent area and separately with a mask having a larger transparent area; or combinations of these methods. Methods for forming an opening having a tapered side wall are further described in co-pending U.S. patent application entitled “Lithographically Defined Microelectronic Contact Structures” which has been referred to above and which is hereby incorporated herein by reference. Also described below is a method in which a mold is used to stamp a slope in a deformable material which is then used to form a resilient contact element.

After operation 508, the operation 510 involves applying a seed layer and then applying and patterning a photoresist layer to create a triangular opening (in one exemplary embodiment) for a resilient contact element. The seed layer 642 shown in FIG. 6G may be applied by conventionally sputtering an appropriate metallic layer (e.g. Cu or Ti or Ti/W) onto the surface of the photoresist 633. If the shorting layer 609 was removed in operation 506, then the seed layer 642 should provide a continuous conductive surface except for the side wall 645, but if the shorting layer 609 was retained in operation 506, then the seed layer 642 may be electrically discontinuous over its entire surface.

In one preferred implementation, care is taken in the sputtering operation to avoid or prevent the sputtered material from remaining on the vertical side wall 645 so the opening in the photoresist 633 does not receive a continuous layer of the seed material. In another implementation, sputtering does cover some or all of the vertical side wall 645. In this implementation, it is generally preferable that the subsequent masking and patterning step cover some or all of the sputtered side wall so as to minimize or prevent subsequent deposition of additional conductive materials on the vertical side wall.

Figure 6G:
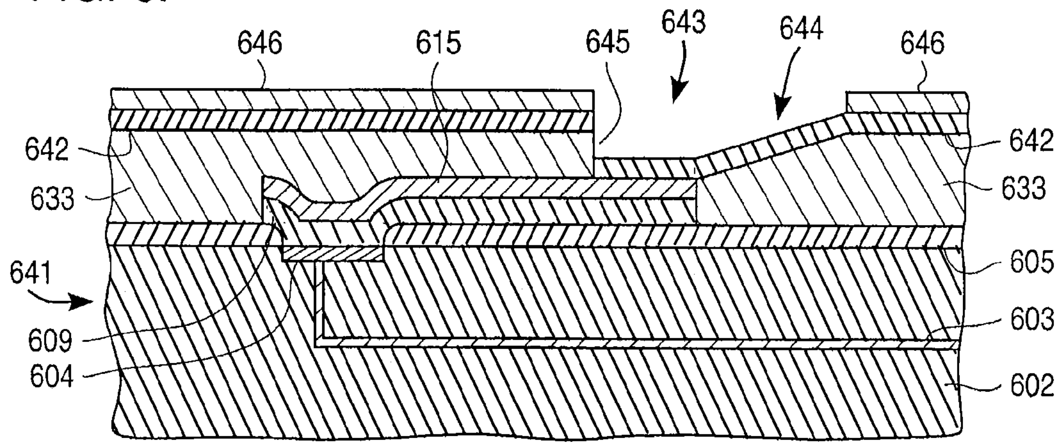
FIG. 6G shows another cross-sectional view after further processing steps of the method of FIG. 5.

After the seed layer 642 is applied, a photoresist layer is applied over the surface of the seed layer 642 as shown in FIG. 6G. This photoresist layer is then patterned to create an opening 643 in the patterned photoresist layer 646 as shown in FIG. 6G. This opening will be used to deposit at least one conductive layer, such as a metal layer, on the top of the exposed portion of the seed layer 642. This will include the deposition of a beam portion of the resilient element on the sloping portion 644 of the exposed portion of the seed layer 642. It is generally desirable for the subsequent plating or other deposition operation to fill the final shape contours in a regular manner. In one preferred embodiment, a seed layer is deposited so as to be primarily at the bottom of an opening in photoresist, particularly where the photoresist is from the masking and patterning phase of operation 510.

Figure 6H:
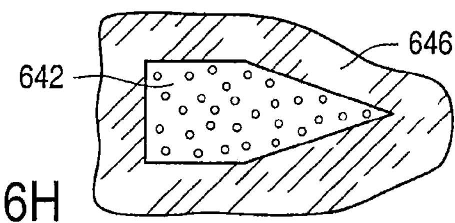
FIG. 6H shows a top view of a portion of the structure shown in FIG. 6G.

FIG. 6G shows an example of a structure 641 after completion of the operation 510. FIG. 6H shows a top view of a portion of the structure 641. In particular, the portion of the structure 641 over the opening 643 is shown in the top view of FIG. 6H. It can be seen that the patterned photoresist layer 646 exposes only a portion of the seed layer 642. In the particular example shown in FIG. 6H, the base portion of the resilient contact element will be formed in the rectangular portion of the exposed seed layer 642 and the beam portion of the resilient contact element will be formed in the triangular portion of the exposed seed layer 642. This will result in a resilient contact structure having a beam portion which is substantially triangular in shape, such as the resilient contact structure shown in FIG. 3A. It will be appreciated that in other embodiments, other shapes, such as rectangular shapes, may be used for the beam portion and thus top views of such structures would look differently than FIG. 6H.

Figure 6I:
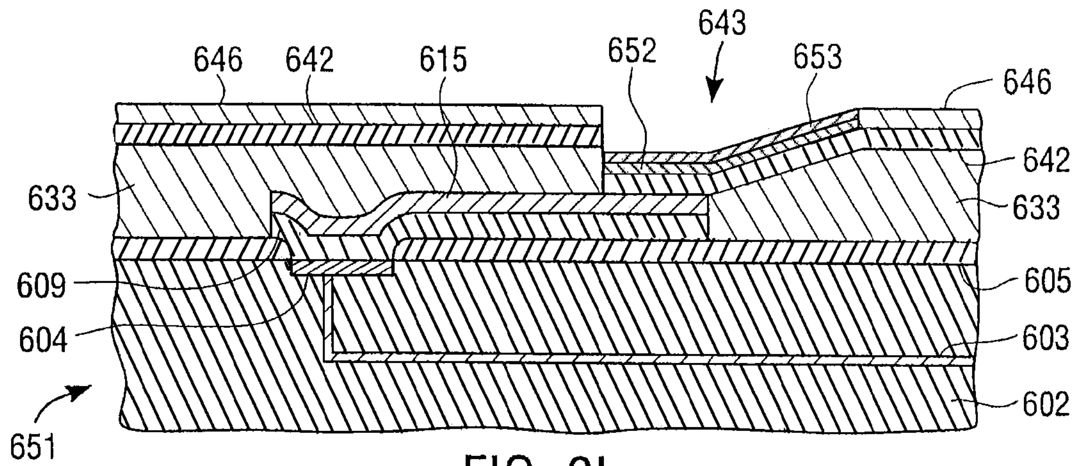
FIG. 6I shows another cross-sectional view of the structure being formed according to the method shown in FIG. 5.

After structure 641 has been created by completing the operation 510, operation 512 is performed on the structure 641 to achieve the structure 651 shown in FIG. 6I. Operation 512 typically involves in one exemplary embodiment the electrolytic plating of a first metal layer and then a second metal layer into the triangular opening. In alternative embodiments, the opening may be a different shape (e.g. a rectangular shape to create a rectangular beam portion) and alternative methods may be employed to deposit one or more conductive layers into the opening. The seed layer 642 (or a retained underlying shorting layer if the seed layer 642 is electrically discontinuous over its surface) will be used as the cathode in the electrolytic plating operation to plate the metal layers 652 and 653 onto the exposed portion of the shorting layer in the opening 643 as shown in FIG. 6I. In one embodiment, the first metal layer 652 is selected to provide sufficient mechanical resiliency so that the final resilient contact element has sufficient resiliency for its intended operation. In one particular embodiment, a nickel cobalt alloy may be used. This alloy may be 70% nickel and 30% cobalt. This alloy may be heat treated as described in co-pending application Ser. No. 08/931,923 filed Sep. 17, 1997. The second metal layer 653 is typically selected to provide good electrical conductivity; for example gold, or rhodium or a palladium cobalt alloy may be used. The composition of the various other layers and materials will be described further below. It will also be appreciated that numerous other types of materials may be selected for these metal layers, and these materials have been described in U.S. Pat. No. 5,476,211.

Figure 6J:
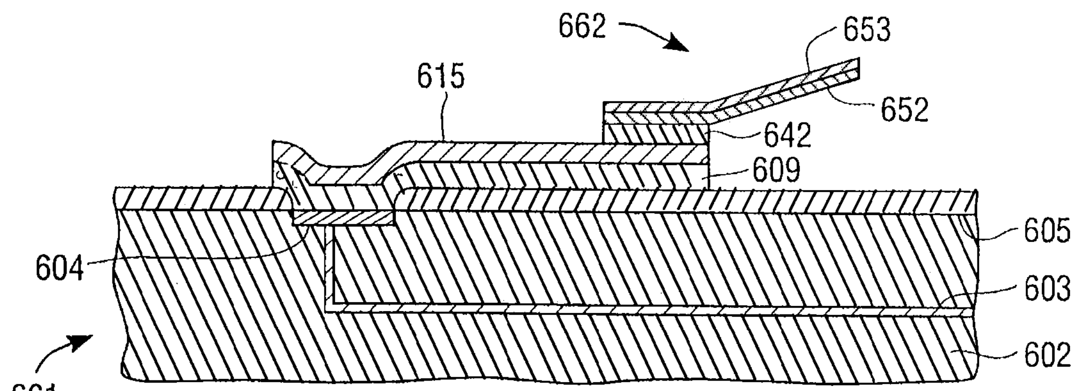
FIG. 6J shows another cross-sectional view of a resilient contact element as it is being formed according to the method shown in FIG. 5.

After one or more conductive layers have been deposited into the opening 643 and the structure 651 has been completed, then operation 514 is performed to remove the photoresist layers and the sputtered shorting layers to achieve the structure 661 shown in FIG. 6J. Conventional solvents or dry etching methods for removing or stripping the photoresist layers are utilized and solvents or etchants which will selectively remove the sputtered seed layer, such as seed layer 642, are used to remove the shorting layer. Thus, the patterned photoresist layer 646 and the patterned photoresist layer 636 is removed. Also, almost all of the seed layer 642 is removed except for the portion of the layer under the base of the resilient contact element 662 as shown in FIG. 6J. This results in the structure shown in FIG. 6J which then may be used as an interconnect assembly (without a travel stop structure) or may be used with a travel stop structure after such structure has been created in operation 516.

If it is desired to create a stop structure for the interconnect assembly, then step 516 is performed on the structure 661. This operation involves the application of a photo-imageable material (PIM), such as a negative photoresist such as SU8 which is commercially available, over the entire surface of the structure 661. It is desirable that this PIM be applied uniformly to a uniform thickness and relatively flat, preferably as flat as possible. Thus it is preferred to spin the PIM, such as a photoresist, onto the surface of the structure 661. Care should be taken to apply enough photoresist material such that after it is spun on, it covers the base of the resilient contact element 662. That is, the height of the final structure created by this spun-on photoresist should be more than the height h of the base of the resilient contact element. Typically, the height of the final structure should also be less than the height of the freestanding contact point of the resilient contact element. Typically, the difference between the height of the freestanding contact point and the height of the final stop structure created by this photoresist should be fabricated to be the maximum deflection amount c described above.

Figure 6K:
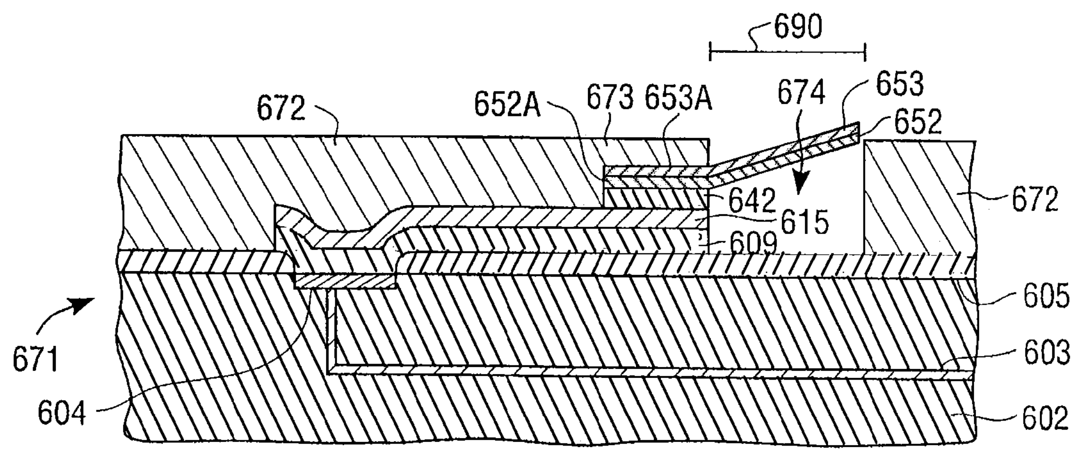
FIG. 6K shows a further cross-sectional view after further processing steps according to the method of FIG. 5.

After the proper amount of photoresist has been applied to achieve the desired height of the photoresist relative to the height h of the base of the resilient contact element (elements), then the photoresist layer is exposed and developed. The photoresist layer is exposed through a mask 690 such that an area around and below the beam portion of the resilient contact element remains unexposed while adjacent regions become exposed. Because the PIM in one embodiment is a negative photoresist, this will mean that the area which did not receive an exposure due to the mask 690 will be developed to remove the photoresist (and the exposed portions of the photoresist will remain), creating the opening 674 as shown in FIG. 6K. In one embodiment, this mask 690 may be a rectangular mask which provides sufficient clearance for the beam portion to move up and down in the opening 674. In an alternative embodiment, the mask 690 may be a triangular mask which is designed to fit around the triangular shape of the beam portion of the resilient contact element when the resilient contact element has a triangular beam shape. Thus, the structure 671 shown in FIG. 6K results from operation 516 and produces a stop structure 672 which is adhered to the passivation layer 605 and to the conductive layer 615 and to the base portions 652A and 653A of the resilient contact structure. Note that a portion 673 of the stop structure 672 is adhered to and is over the base portions 653A and 652A.

Figure 6L:
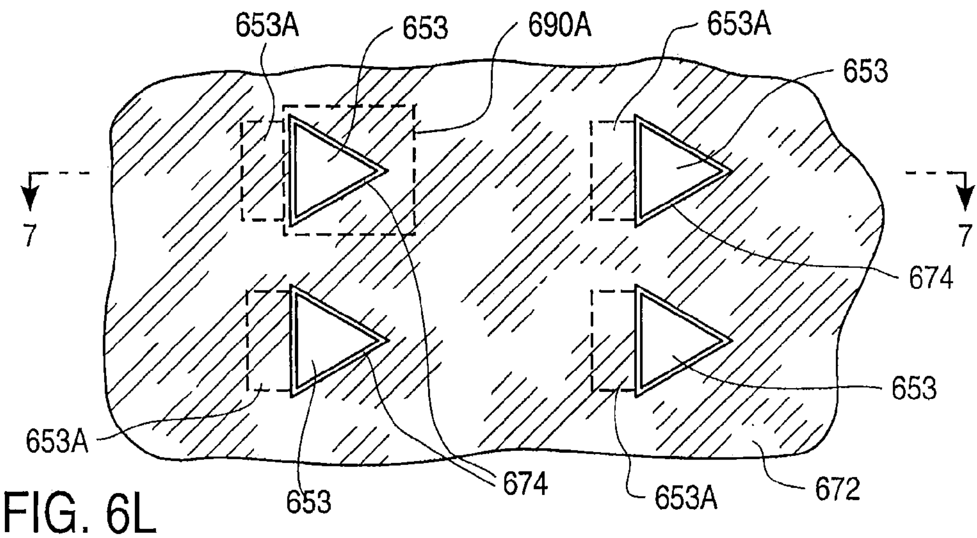
FIG. 6L shows a top view according to one embodiment of the structure shown in FIG. 6K.

FIG. 6L shows a top view of the structure shown in FIG. 6K. FIG. 6L assumes that the mask 690 had a triangular shape rather than a rectangular shape. Thus, the opening in the patterned photoresist 672 which forms the stop structure is a triangular opening which matches the shape of the triangular beam portion while providing sufficient clearance for the beam portion to move up and down within the opening 674. The base **653*a* is shown underlying the travel stop structure 672 in FIG. 6L. In an alternative embodiment, a rectangular mask 690*a* may be used over the beam portion in the exposure operation 516 to create a rectangular opening 674*a* shown in FIG. 7B. This rectangular opening in the stop structure 672 may be used either for a triangular beam portion as shown in FIG. 7B or may be used for a beam portion which is rectangular. It will be appreciated that whichever mask geometry is selected, it should provide sufficient clearance for the beam portion to move up and down within the opening in the stop structure 672**.

Figure 7A:
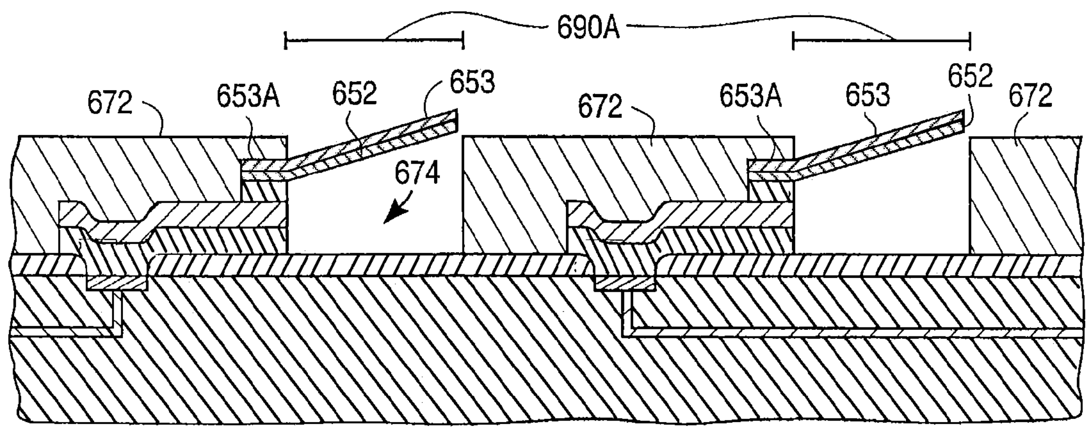
FIG. 7A shows in cross-sectional view an embodiment with multiple resilient contact elements and their corresponding stop structures.
Figure 7B:
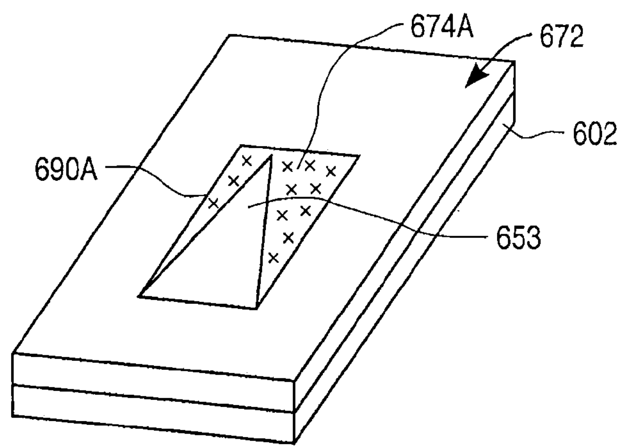
FIG. 7B shows a perspective view of one resilient contact element disposed within a well formed by the contact structure according to one exemplary embodiment of the present invention.

FIG. 7A shows a cross-sectional view of a plurality of resilient contact elements which include stop structures surrounding and disposed on the bases of the resilient contact elements.

Figure 8A:
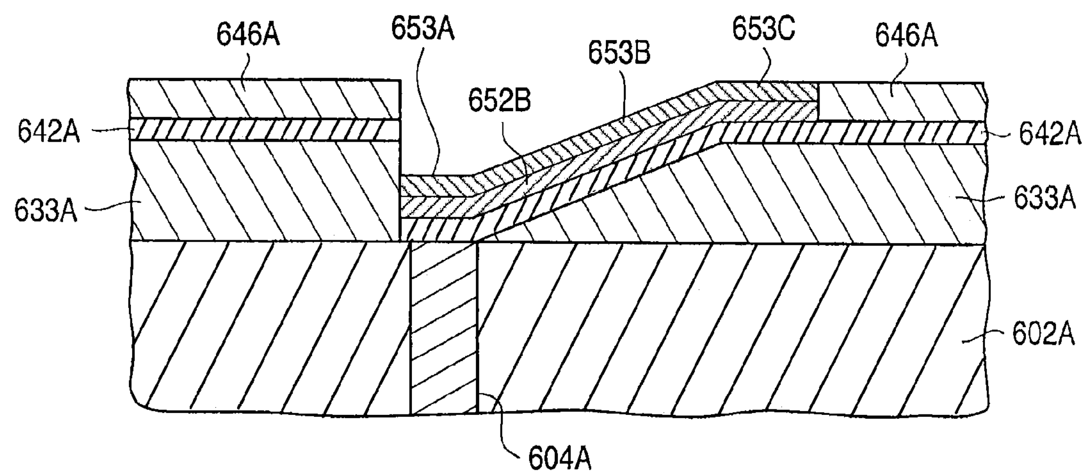
FIG. 8A shows an alternative embodiment in cross-sectional view of a resilient contact element according to the present invention.
Figure 8B:
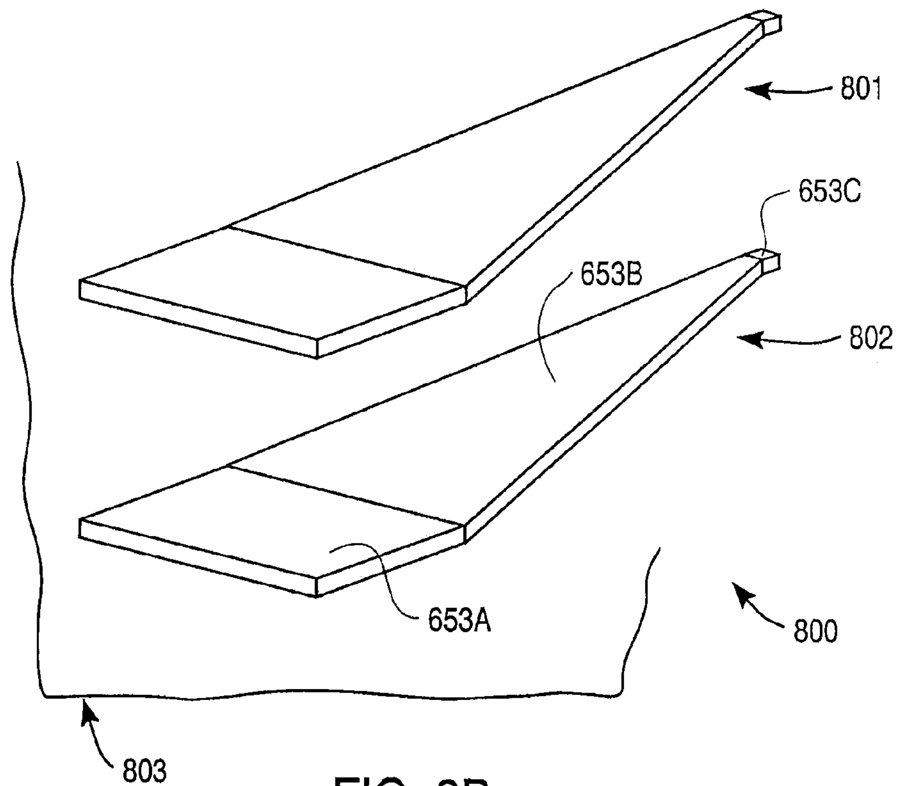
FIG. 8B shows in perspective view the resilient contact element of FIG. 8A after the element has been assembled.

FIG. 8A shows an alternative embodiment for creating a resilient contact element which includes three portions, a base portion, a beam portion, and a contact portion. The contact portion is useful for contacting a second electronic component as described above in detail. In addition, the contact portion may be used to attach a tip structure onto the end of the beam. Examples of various tip structures and methods for mounting tip structures are described in the co-pending U.S. patent application entitled "Lithographically Defined Microelectronic Contact Structures" and also in co-pending U.S. patent application Ser. No. 08/819,464, which was filed Mar. 17, 1997. In particular, FIG. 8A shows the structure after a stage in the fabrication process of an interconnection assembly after operation 512 (without operations 502, 504, and 506 because this assembly does not utilize a redistribution layer). The structure of FIG. 8A includes a conductive post 604*a* disposed in an insulating layer of the substrate 602*a*. The conductive post is electrically coupled to a seed layer 642*a* which corresponds to the seed layer 642 of FIG. 6I. The seed layer 642*a* has been sputtered over a patterned photoresist layer 633*a* which includes an opening having a sloped side wall. The sputtered seed layer 642*a* is used to electrolytically plate two metal layers to create the structure shown in FIG. 8A. The electroplating operation occurs through the patterned photoresist mask 646*a* which corresponds to the patterned mask 646 of FIG. 6I. After the plating operation has occurred, each metal layer includes a base portion, such as the base portion 653*a*, a beam portion, such as the beam portion 653*b*, and a contact portion, such as the contact portion 653*c*. After the electroplating operation is completed, operation 514 may be performed to remove the photoresist layers 646*a* and 633*a* and then the sputtered seed layer 642*a* may be removed except for the portion under the base 653*a*. The resulting structure may be used as a resilient contact element in an interconnect assembly without a stop structure or the stop structure may be formed by performing operation 516 as described above.

FIG. 8B illustrates an array 800 of two resilient contact elements 801 and 802 on the surface of the substrate 803. FIG. 8B is a perspective view and it will be appreciated that typically a large number of resilient contact elements may be disposed on the surface of the substrate, such as a semiconductor integrated circuit or other interconnect assemblies. The resilient contact elements shown in FIG. 8B are similar to the type shown in FIG. 8A in that they include a contact portion at the end of the beam structure. The beam structure, such as beam portion 653B, may be a substantially triangular shape which is attached to the base portion 653A. The contact portion 653C may serve itself as the contact tip for making contact to another contact terminal (e.g. contact terminal 411 as shown in FIG. 4) or a tip structure as described above may be mounted onto the foot portion 653C to provide a tip structure. This structure may also be adapted for permanent connection to the contact pad (e.g. by use of solder or conductive epoxy).

Figure 9A:
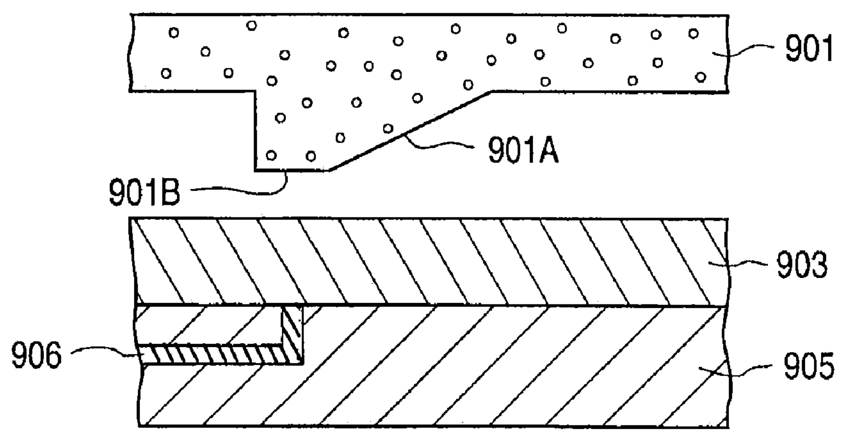
FIGS. 9A, 9B, 9C and 9D show cross-sectional views of a substrate during another method, according to the invention, for forming a resilient contact element.

FIGS. 9A, 9B, 9C and 9D illustrate another method for forming a resilient contact element according to the present invention. A mold 901, which may be photolithographically formed, includes a "negative" image of at least a portion of a resilient contact element. The mold 901 is shown in FIG. 9A prior to being used on the deformable material 903 and is positioned above the deformable material 903, which is disposed on a substrate 905 which includes wiring layer 906. The substrate 905 and wiring layer 906 is similar to the structure shown in FIG. 6E. The deformable material 903 may be any number of materials, such as PMMA (poly methyl methacrylate), which are deformable when pressed with a mold or stamp and which can be used to receive the deposition of spring metals to form a resilient contact element and can be subsequently removed. The mold 901 includes, in the embodiment shown in FIG. 9A, a base portion 901B and a sloped portion 901A. It will be appreciated that other geometries may be used, including a rotated "L" shape (e.g. ¬) or a shape that will generate the curved beam portion of FIG. 2D.

Figure 9B:
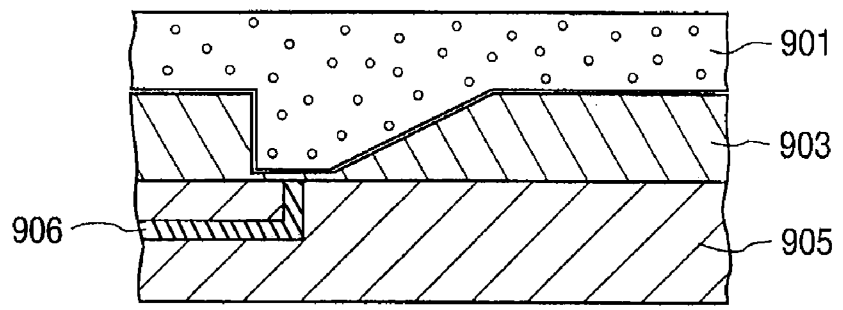
Figure 9C:
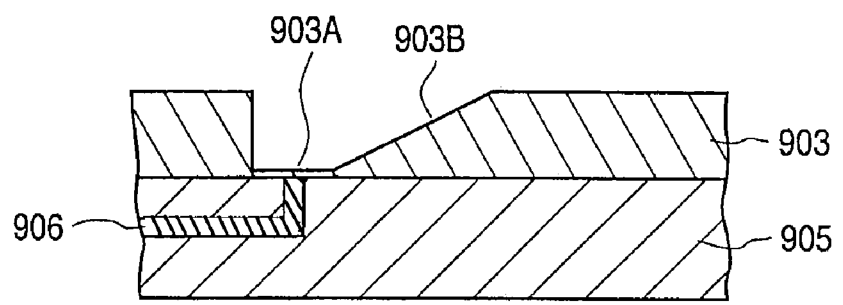
Figure 9D:
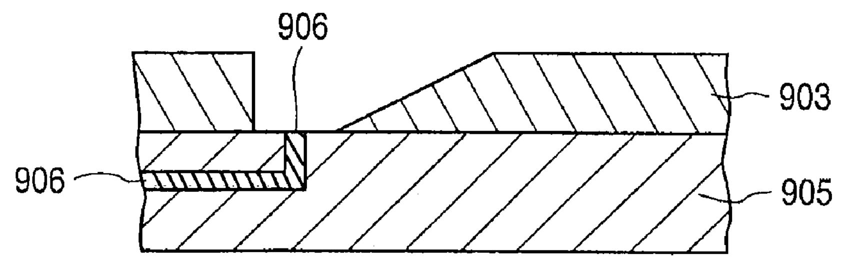

The mold 901 is pressed into the deformable material as shown in FIG. 9B. Several pounds of pressure may be necessary (depending on the type of deformable material) in order to deform the deformable material to achieve the desired shape. This in one exemplary embodiment causes the base portion 901B to be nearly touching the surface of substrate 905, leaving a thin region of the deformable material separating this surface from the base portion 901B. The mold 901 forces the deformable material to take the positive of its negative shape as shown in FIG. 9B. The mold 901 is then separated from the substrate 905 and deformable material 903, leaving the structure shown in FIG. 9C. This structure is then "cleaned" to remove the thin region 903A of the deformable material which was under the base portion 901B. The structure may be cleaned with an isotopic etch which removes all exposed deformable material but does not effect the substrate 905. This etch is performed for a sufficient duration to remove all of the thin region 903A while leaving most of the remainder of the deformable material 903, including the sloped portion 903B. The structure may be cleaned to remove the thin region 903A with a plasma etch or a reactive ion etch or with a laser ablation etch. After removal of the thin region 903A, the structure is shown in FIG. 9D, and it is ready for further processing (e.g. operations 510, 512, 514, and 516 of FIG. 5) to create a resilient contact element using the molded deformable material.

There are numerous ways to create the mold. The mold may be formed from a silicon wafer by laser etching the surface of the wafer. A glass backing substrate with a photoimageable material (which can be hardened) may be used with a mask to photolithographically define the mold. A silicon carbide wafer may be machined to define the mold by using electro-discharge machining techniques oh the silicon carbide wafer. A negative of the mold may be formed in wax (e.g. paraffin), then sputtering a shorting layer on the surface of the negative, after which the mold is formed by electrolytically plating a metal onto the shorting layer on the wax.

The foregoing discussion has provided certain details with respect to materials and process steps. It will be appreciated that the present invention may be practiced with other types of materials and process variations. For example, in just some of many preferred implementations, the sputtered shorting layers may use copper, gold, aluminum, titanium, titanium/tungsten or other appropriate metallization. Further, the redistribution trace 615 may use copper or gold material in creating the trace. Other materials may be employed to achieve similar results as will be appreciated by those skilled in the art. As another alternative embodiment, it will be appreciated that other methods for forming various layers may be employed. For example, processes based on electroless plating, chemical vapor deposition (CVD), or phase vapor deposition (PVD) may be utilized rather than electrolytic plating.

In the foregoing specification, the present invention has been described with reference to specific exemplary embodiments thereof. It will, however, be evident that various modifications and changes may be made thereto without departing from the broader scope and spirit of the invention as set forth in the appended claims.

What is claimed is:

1. An electronic component comprising:

a substrate including a conductive element disposed at a surface of the substrate; and a freestanding, resilient, electrically conductive contact structure comprising a base portion attached to the conductive element, a tip portion displaced a vertical distance away from the surface of the substrate, and a beam portion between the base portion and the tip portion, a length of the beam portion extending from where the base portion is attached to the conductive element to where the beam portion meets the tip portion, the beam portion being displaced away from the surface of the substrate along all of the length, wherein:

a width dimension of the beam portion decreases along all of the length of the beam portion, all of the length of the beam portion is shaped in a convex curve that is convex with respect to the surface of the substrate, and the width dimension of the beam portion is parallel to the surface of the substrate where the beam portion and the tip portion meet.

2. The electronic component of claim 1 further comprising:

a connecting layer coupling the conductive element to internal circuitry within the electronic component;

a passivation layer disposed on the surface of the substrate, the passivation layer having an opening at the conductive element; and at least one electrically conductive layer disposed on the passivation layer and on the conductive element, wherein the base portion of the contact structure is electrically coupled through the at least one electrically conductive layer to the conductive element.

3. The electronic component of claim 2, wherein the conductive element comprises a terminal.

4. The electronic component of claim 2, wherein the tip portion comprises a pointed end.

5. The electronic component of claim 2, wherein the substrate comprises a semiconductor device.

6. The electronic component of claim 2, wherein the contact structure comprises the plurality of layers.

7. The electronic component of claim 6, wherein ones of the layers comprise metals.

8. The electronic component of claim 2 further comprising a plurality of the contact structures, wherein adjacent contact structures are spaced between 2.5 microns and 2000 microns from each other.

9. The electronic component of claim 2, wherein the tip portion comprises a beveled peripheral edge.

10. The electronic component of claim 2, wherein the beam portion comprises a triangular shape.

11. The electronic component of claim 10, wherein the tip portion comprises a quadrilateral shape.

12. The electronic component of claim 11, wherein the tip portion comprises a rectangular shape.

13. The electronic component of claim 1, wherein the plurality of layers comprise an electrically conductive seed layer and a layer of structural material disposed on the seed layer.

14. The electronic component of claim 1, wherein the beam portion comprises the plurality of layers of materials.

15. The electronic component of claim 1, wherein the vertical distance is perpendicular to the surface of the substrate at which the conductive element is disposed.

16. The electronic component of claim 1, wherein the tip is disposed above the surface of the substrate at which the conductive element is disposed.

17. The electronic component of claim 1 wherein the base portion comprises a plurality of layers, a first of the layers comprising a first material and a second of the layers comprising a second material, the first material being different than the second material.

18. The electronic component of claim 1 further comprising a plurality of conductive contact structures each comprising a base portion attached to a conductive element disposed at the surface of the substrate, a tip portion displaced a vertical distance away from the surface of the substrate, and a beam portion between the base portion and the tip portion, wherein each of the contact structures is free standing and structurally distinct from the others of the contact structures.

19. The electronic component of claim 18 further comprising a stop structure disposed on the surface of the substrate, the stop structure comprising a plurality of openings, tip portions of the plurality of contact structures extending through the openings.

20. The electronic component of claim 19, wherein the stop structure covers substantially an entire portion of the surface of the substrate.

21. The electronic component of claim 18, wherein:

the base portion of each contact structure is generally rectangular, the tip portion of each contact structure is generally rectangular, and a spacing between centers of adjacent tip portions is less than a spacing between centers of adjacent base portions.

22. An electronics system comprising:

a first substrate including a conductive element disposed at a surface of the first substrate;

a freestanding, resilient, electrically conductive contact structure comprising a base portion attached to the conductive element of the first substrate, one and only one tip portion displaced a vertical distance away from the surface of the first substrate, and one and only one beam portion between the base portion and the tip portion, wherein a length of the beam portion extends from where the base portion is attached to the conductive element to where the beam portion meets the tip portion, the beam portion being displaced away from the surface of the substrate along all the length of the beam portion, wherein a width of the beam portion decreases along all of the length of the beam portion, all of the length of the beam portion is shaped in a convex curve that is convex with respect to the surface of the substrate, and the width dimension of the beam portion is parallel to the surface of the substrate where the beam portion and the tip portion meet; and a second substrate including a conductive contact element in physical contact with the one and only one tip portion of the contact structure and deflecting the contact structure, the contact structure exerting a force against the contact element due to the resiliency of the contact structure.

23. The electronics system of claim 22 further comprising:

a connecting layer coupling the conductive element to internal circuitry within the first substrate;

a passivation layer disposed on the surface of the first substrate, the passivation layer having an opening at the conductive element of the first substrate; and at least one electrically conductive layer disposed on the passivation layer and on the conductive element of the first substrate, wherein the contact structure is electrically coupled through the at least one electrically conductive layer to the conductive element of the first substrate.

24. The electronics system of claim 23, wherein the conductive element comprises a terminal.

25. The electronics system of claim 23, wherein the tip portion comprises a pointed end.

26. The electronics system of claim 23, wherein the first substrate comprises a semiconductor device.

27. The electronics system of claim 23, wherein the contact structure comprises a metal layer.

28. The electronics system of claim 27, wherein the contact structure comprises a plurality of metal layers.

29. The electronics system of claim 23 further comprising a plurality of the contact structures, wherein adjacent contact structures are spaced between 2.5 microns and 2000 microns from each other.

30. The electronics system of claim 23, wherein the tip portion comprises a beveled peripheral edge.

31. The electronics system of claim 23, wherein the beam portion comprises a triangular shape.

32. The electronics system of claim 31, wherein the tip portion comprises a quadrilateral shape.

33. The electronics system of claim 32, wherein the tip portion comprises a rectangular shape.

34. The electronics system of claim 22, wherein the vertical distance is perpendicular to the surface of the substrate at which the conductive element is disposed.

35. The electronics system of claim 22, wherein the tip is disposed above the surface of the substrate at which the conductive element is disposed.

36. The electronics system of claim 22 further comprising a plurality of conductive contact structures each comprising a base portion attached to a conductive element disposed at the surface of the substrate, a tip portion displaced a vertical distance away from the surface of the substrate, and a beam portion between the base portion and the tip portion, wherein each of the contact structures is free standing and structurally distinct from the others of the contact structures.

37. The electronics system of claim 36 further comprising a stop structure disposed on the surface of the substrate, the stop structure comprising a plurality of openings, tip portions of the plurality of contact structures extending through the openings.

38. The electronics system of claim 37, wherein the stop structure covers substantially an entire portion of the surface of the substrate.

39. The electronics system of claim 36, wherein:

the base portion of each contact structure is generally rectangular, the tip portion of each contact structure is generally rectangular, and a spacing between centers of adjacent tip portions is less than a spacing between centers of adjacent base portions.

* * * * *